(12) United States Patent
Kondo

(10) Patent No.: US 10,739,674 B2
(45) Date of Patent: Aug. 11, 2020

(54) IMPRINT APPARATUS AND METHOD FOR PRODUCING ARTICLE

(71) Applicant: CANON KABUSHIKI KAISHA, Tokyo (JP)

(72) Inventor: Yousuke Kondo, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 394 days.

(21) Appl. No.: 15/362,568

(22) Filed: Nov. 28, 2016

(65) Prior Publication Data
US 2017/0157810 A1 Jun. 8, 2017

(30) Foreign Application Priority Data
Dec. 3, 2015 (JP) .................................. 2015-236991

(51) Int. Cl.
*B29C 59/02* (2006.01)
*G03F 7/00* (2006.01)

(52) U.S. Cl.
CPC .................................. *G03F 7/0002* (2013.01)

(58) Field of Classification Search
CPC .................................................... G03F 7/0002
See application file for complete search history.

(56) References Cited

U.S. PATENT DOCUMENTS

2013/0056905 A1* 3/2013 Hamaya ................ G03F 7/0002
264/293
2014/0339734 A1* 11/2014 Murakami ............ G03F 7/0002
264/293

FOREIGN PATENT DOCUMENTS

| JP | H08-279549 A | 10/1996 |
|----|--------------|---------|
| JP | 4667524 B2 | 4/2011 |
| JP | 2013-004744 A | 1/2013 |
| JP | 2013-055327 A | 3/2013 |
| JP | 5198282 B2 | 5/2013 |
| JP | 2013-254783 A | 12/2013 |
| JP | 2015-50437 A | 3/2015 |
| WO | 09/153925 A1 | 12/2009 |

* cited by examiner

*Primary Examiner* — Ryan M Ochylski
(74) *Attorney, Agent, or Firm* — Canon U.S.A., Inc. I.P. Division

(57) ABSTRACT

An imprint apparatus, to perform an imprinting process for bringing a mold and an imprint material on a substrate into contact with each other and curing the imprint material, includes a substrate deforming mechanism and a controller. The substrate deforming mechanism deforms the substrate in such a manner that a surface geometry of at least part of the substrate protrudes toward the mold. The controller determines a condition for the imprinting process on a shot area of the substrate based on the surface geometry of the shot area when the mold is brought into contact with the imprint material on the shot area.

20 Claims, 9 Drawing Sheets

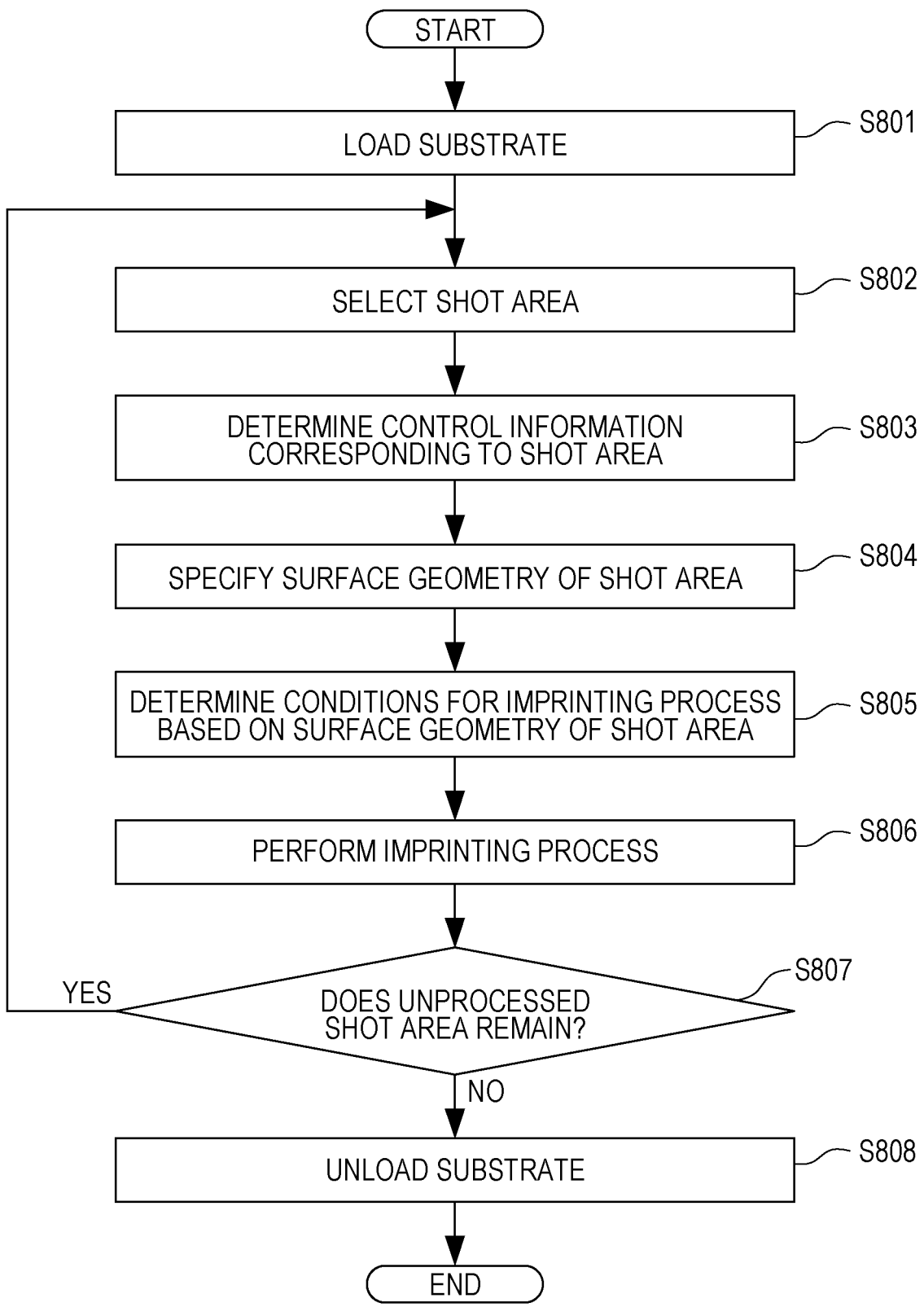

US 10,739,674 B2

IMPRINT APPARATUS AND METHOD FOR PRODUCING ARTICLE

BACKGROUND OF THE INVENTION

Field of the Invention

The present disclosure relates to an imprint apparatus and a method for producing an article.

Description of the Related Art

Imprint apparatuses for forming a pattern on a substrate by supplying an imprint material onto the substrate and curing the imprint material, with the imprint material and the mold in contact with each other, are drawing attention. For such imprint apparatuses, there is a technique for deforming one of the mold and the substrate such that it protrudes toward the other. Japanese Patent No. 5198282 discloses a technique for deforming a mold so that the mold protrudes toward a substrate when the mold is brought into contact with an imprint material on the substrate. Japanese Patent No. 4667524 discloses a technique for deforming the substrate so that the substrate protrudes toward the mold.

In such a method for forming a pattern in a shot area of the substrate by imprinting in a state in which at least part of the substrate is deformed to protrude toward the mold, the surface shape of the imprinting target shot area can differ among the shot areas. However, the related art does not consider that the surface shape of the target shot area can differ among the shot areas in such a method, and therefore the mold can deteriorate fast or the formed pattern can have a defect.

SUMMARY OF THE INVENTION

An imprint apparatus, according to an aspect of the present disclosure, to perform an imprinting process for bringing a mold and an imprint material on a substrate into contact with each other and curing the imprint material, includes a substrate deforming mechanism configured to deform the substrate in such a manner that a surface geometry of at least part of the substrate protrudes toward the mold, and a controller configured to determine a condition for the imprinting process on a shot area of the substrate based on the surface geometry of the shot area when the mold is brought into contact with the imprint material on the shot area.

Further features of the present invention will become apparent from the following description of exemplary embodiments with reference to the attached drawings.

BRIEF DESCRIPTION OF THE DRAWINGS

FIG. 9 is a flowchart of the operation of an imprint apparatus in a producing mode according to an embodiment of the present disclosure.

DESCRIPTION OF THE EMBODIMENTS

Embodiments of the present disclosure will be described hereinbelow with reference to the accompanying drawings.

Figure 1:
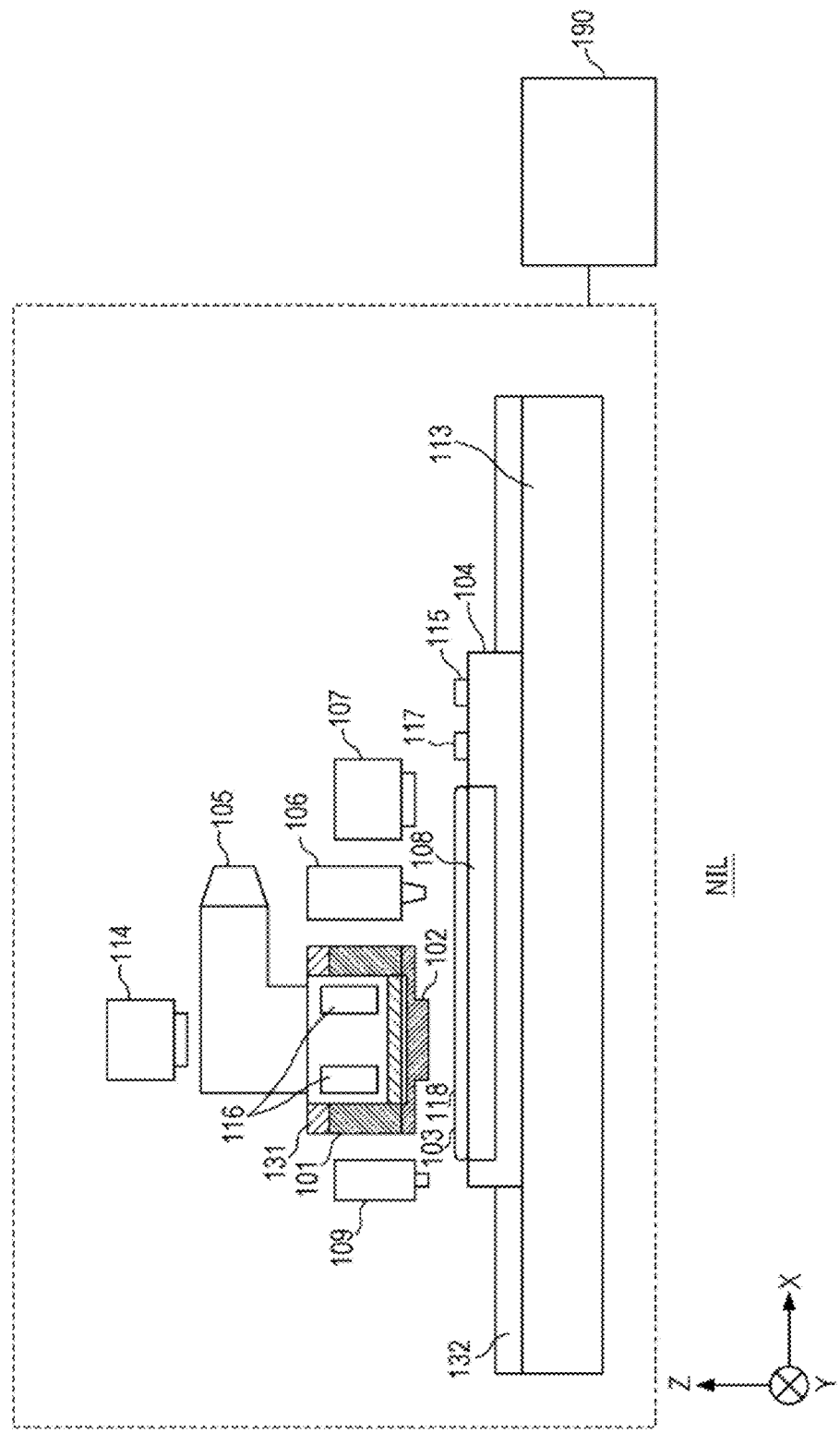
FIG. 1 is a diagram schematically illustrating the configuration of an imprint apparatus according to an embodiment of the present disclosure.

FIG. 1 schematically illustrates the configuration of an imprint apparatus nanoimprint lithography (NIL) according to an embodiment of the present disclosure. The imprint apparatus NIL forms a pattern by shaping an imprint material supplied on a substrate 103 with a mold 102 and curing the shaped imprint material. The imprint material is a curable composition that is cured by curing energy. The imprint material is either in a cured state or an uncured state. Examples of the curing energy include electromagnetic waves and heat. Examples of the electromagnetic waves include light of a wavelength selected from 10 nanometers (nm) or more and 1 millimeter (mm) or less (for example, infrared rays, visible light, and ultraviolet rays).

A typical example of the curable composition is a composition cured when irradiated with light or heated. A photocurable composition cured by light can contain at least a polymerrizable compound and a photopolymerization initiator. The photocurable composition can additionally contain a nonpolymerizable compound or a solvent. An example of the nonpolymerizable compound can be at least one selected from a sensitizer, a hydrogen donator, an internal mold releasing agent, a surface-activating agent, an antioxidant, and polymers.

In this specification and the accompanying drawings, directions are indicated in the XYZ coordinate system in which a plane parallel to the surface of the substrate 103 is an X-Y plane. Directions parallel to an X-axis, a Y-axis, and a Z-axis in the XYZ coordinate system are respectively referred to as X-direction, Y-direction, and Z-direction, and rotation about the X-axis, rotation about the Y-axis, and rotation about the Z-axis are respectively referred to as $\theta X$, $\theta Y$, and $\theta Z$. Control or driving about the X-axis, Y-axis, and Z-axis is respectively control or driving about a direction parallel to the X-axis, a direction parallel to the Y-axis, and a direction parallel to the Z-axis. Control or driving about the $\theta X$-axis, $\theta Y$-axis, and $\theta Z$-axis is respectively control or driving about rotation about an axis parallel to the X-axis, rotation about an axis parallel to the Y-axis, and rotation about an axis parallel to the Z-axis.

The imprint apparatus NIL includes, for the operation of the substrate 103, a substrate stage 104, a support base 113 that supports the substrate stage 104, and a substrate driving unit 132 that drives the substrate 103 by driving the substrate stage 104. The substrate stage 104 incorporates a substrate chuck 108 that holds the substrate 103. The substrate stage 104 can be provided with a reference mark 115. For the operation of the mold 102, the imprint apparatus NIL includes a mold holding unit 101 that holds the mold 102 and a mold driving unit 131 that drives the mold 102 by driving the mold holding unit 101. The substrate driving unit 132 and the mold driving unit 131 constitutes a relative driving mechanism for adjusting the relative position and rotation of the substrate 103 and the mold 102 about the six axes of the X-axis, Y-axis, Z-axis, θX-axis, θ Y-axis, and θZ-axis.

In one example, the substrate driving unit 132 drives the substrate stage 104 to drive the substrate 103 about a plurality of axes (for example, the three axes of the X-axis, Y-axis, and Z-axis). The mold driving unit 131 drives the mold holding unit 101 to drive the mold 102 about a plurality of axes (for example, the six axes of the X-axis, Y-axis, Z-axis, θX-axis, θY-axis, and θZ-axis). The relative driving mechanism adjusts the relative position of the substrate 103 and the mold 102 about the X-axis, Y-axis, θX-axis, θY-axis, and θZ-axis and also about the Z-axis. The adjustment of the relative position of the substrate 103 and the mold 102 about the Z-axis includes an operation for bringing the imprint material on the substrate 103 and the mold 102 into contact with each other and an operation for separating the mold 102 from the cured imprint material.

The imprint apparatus NIL can further include one or a plurality of alignment scopes 116, a substrate measuring device 109, an off-axis alignment scope 107, a curing unit 105, an observing unit 114, a dispenser (a supply unit) 106, and a mold measuring device 117. Each alignment scope 116 outputs information indicating the relative position of a mark on the mold 102 and a mark on the substrate 103, for example, an image of a mark on the mold 102, an image of a mark on the substrate 103, and an image of moire formed from the mark on the mold 102 and the mark on the substrate 103. In one example, providing four alignment scopes 116 allows marks at the four corners of a shot area (shot region) of the substrate 103 to be observed at a time.

The substrate measuring device 109 measures the geometry of a surface 118 of the substrate 103. More specifically, the substrate measuring device 109 can be configured to measure the height of the surface 118 of the substrate 103 at a plurality of positions. The substrate measuring device 109 can include a sensor capable of measuring distances. The off-axis alignment scope 107 observes marks on the substrate 103. The curing unit 105 supplies energy (for example, light) for curing an imprint material supplied onto the substrate 103 to the imprint material to thereby cure the imprint material. The observing unit 114 observes the state of contact of the imprint material and the mold 102 and the filled state of the imprint material in the pattern of the mold 102. The dispenser (the supply unit) 106 is a supply unit that supplies an imprint material onto the substrate 103. The dispenser 106 can include an ejecting portion in which a plurality of ejection ports for ejecting the imprint material are arrayed. The dispenser 106 can include a driving mechanism for driving the ejecting portion about a plurality of axes (for example, six axes). The mold measuring device 117 measures the geometry of the surface of the mold 102. More specifically, the mold measuring device 117 measures the height of the surface of the mold 102 at a plurality of positions. The mold measuring device 117 can include a sensor capable of measuring distances.

Figure 2A:
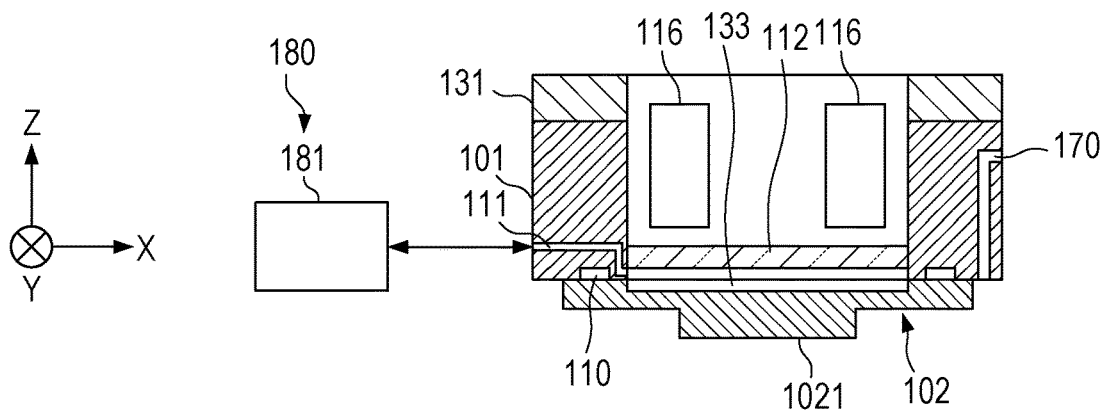
FIG. 2A is a cross-sectional view of a mold holding unit and its periphery schematically illustrating the configuration thereof.

FIG. 2A is a cross-sectional view of the mold holding unit 101 and its periphery schematically illustrating the configuration thereof. The mold holding unit 101 includes, for example, a suction unit 110, and holds the mold 102 by sucking the mold 102 with the suction unit 110. The mold 102 includes a mesa-like patterned portion 1021, on which a pattern is formed. The mold holding unit 101 includes, for example, a structure for transmitting curing energy supplied from the curing unit 105 (for example a hollow structure). The mold holding unit 101 can include a sealing member (for example, sheet glass) 112 that forms a pressure chamber 133 at the back of the mold 102 (a surface opposite to the patterned surface), and a channel 111 and a pressure control unit 181 for controlling the pressure in the pressure chamber 133. Alignment scopes 116 may reside above the sealing member 112. The pressure control unit 181 is connected to the pressure chamber 133 through the channel 111. The pressure control unit 181 keeps the pressure in the pressure chamber 133 higher than the pressure in external space, so that the mold 102 can be deformed such that the central portion (the patterned portion 1021) of the mold 102 protrudes toward the substrate 103. The channel 111 and the pressure control unit 181 constitute a mold deforming mechanism 180 for adjusting the deformation of the mold 102. The mold driving unit 131 can be configured to drive the mold 102 about a plurality of axes (for example, the six axes of X-axis, Y-axis, Z-axis, θX-axis, θY-axis, and θZ-axis) by driving the mold holding unit 101 about the plurality of axes.

The imprint apparatus NIL can include a gas supply unit 170 that supplies purge gas into a space between the substrate 103 and the mold 102. The gas supply unit 170 can include, for example, a channel in the mold holding unit 101. The purge gas can be a gas that does not inhibit curing of the imprint material, for example, a gas containing at least one of a helium gas, a nitrogen gas, and a condensable gas (for example, pentafluoropropane [PFP]). The imprint apparatus NIL further includes a control unit 190 for controlling the above components.

Figure 2B:
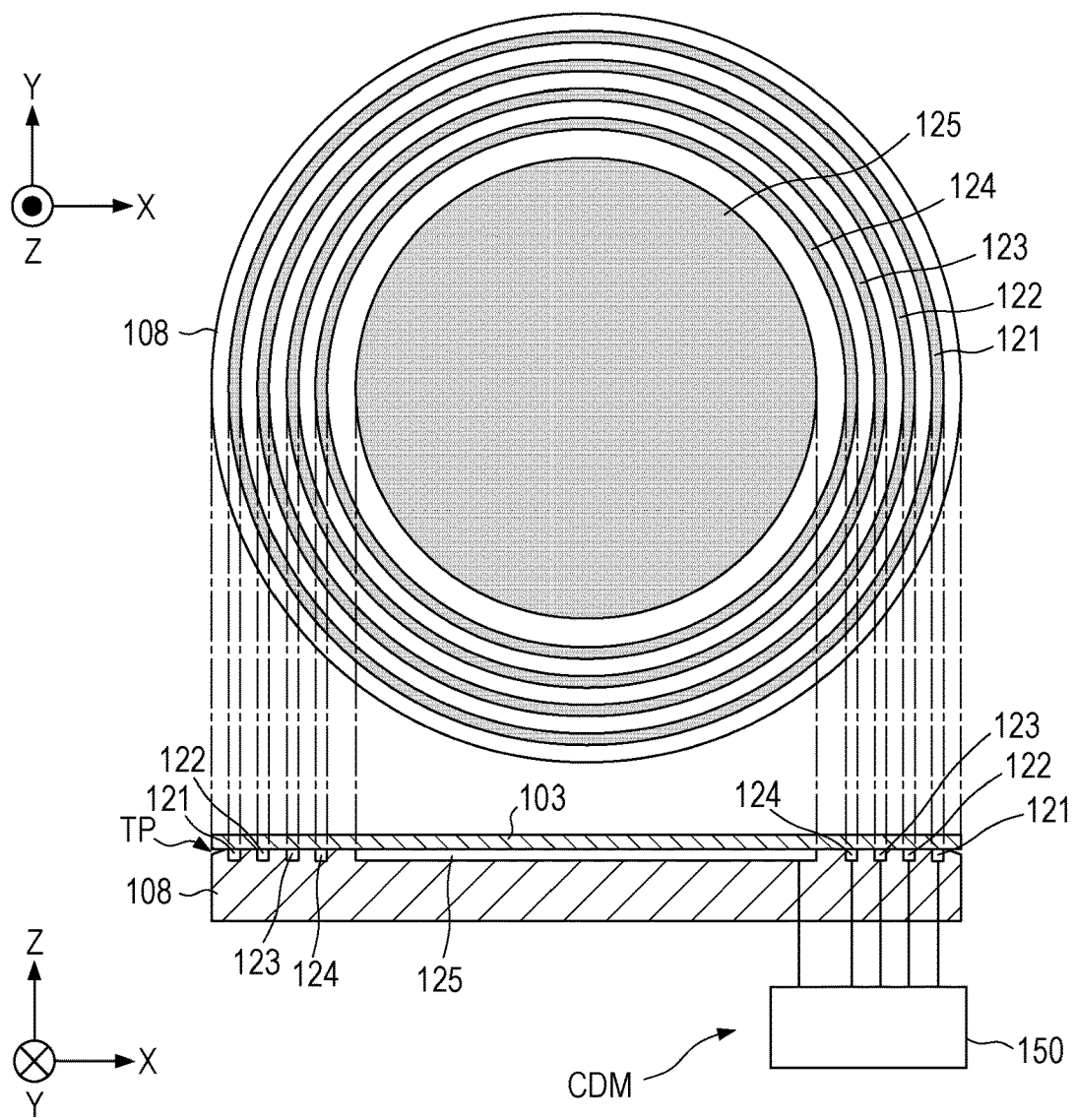
FIG. 2B is a diagram schematically illustrating the configuration of a substrate chuck.

FIG. 2B schematically illustrates the configuration of the substrate chuck 108. The substrate chuck 108 includes a sucking and deforming unit CDM that sucks the substrate 103 and deforms the substrate 103. The sucking and deforming unit CDM controls the pressure distribution at the back of the substrate 103 so that the substrate 103 has a target shape. The sucking and deforming unit CDM is capable of deforming the substrate 103 so that at least part of the substrate 103 protrudes upwards (toward the mold 102). The sucking and deforming unit CDM can include a plurality of recessed portions 121 to 125 in a surface of the substrate chuck 108 and a pressure control unit 150 capable of controlling the individual pressures in the plurality of recessed portions 121 to 125. For example, when the pressure control unit 150 applies negative pressure to the recessed portions 121 and 125, and positive pressure to the recessed portions 122, 123, and 124, the sucking and deforming unit CDM can hold the substrate 103 while deforming the portions of the substrate 103 corresponding to the recessed portions 122, 123, and 124 upward in a protrudent shape. The number of recessed portions 121 to 125 is not limited to five and may be any number according to required specifications. The ranges and values of pressure that the pressure control unit 150 can apply to the individual recessed portions 122, 123, and 124 are also determined according to the required specifications. The recessed portions 122, 123, and 124 may be concentric or ring-shaped circles, as illustrated in FIG. 2B, or may have another shape. The substrate chuck 108 may have a tapered portion TP at the periphery in the surface facing the substrate 103. Providing the tapered portion TP makes it easy to deform the substrate 103, in particular, the periphery of the substrate 103, upward in a protrudent shape.

The sucking and deforming unit CDM has the function of sucking (holding) the substrate 103 and the function of deforming the substrate 103, as described above. In other words, the sucking and deforming unit CDM serves both as a substrate holding mechanism and a substrate deforming mechanism. In some embodiments, the above functions are separately provided. For example, the function of sucking (holding) the substrate 103 may be provided by a vacuum chuck, and the function of deforming the substrate 101 may be provided by an electrical device (for example, a piezoelectric element) and/or a mechanical device (for example, a cylinder). Alternatively, the function of holding the substrate 103 may be provided by an electrical device (for example, an electrostatic chuck), and the function of deforming the substrate 103 may be provided by a pressure control device, as illustrated in FIG. 2B.

The substrate 103 can be made of silicon, plastic, gallium arsenide, mercury telluride, or a composite material containing two or more materials selected from the above. The surface 118 of the substrate 103 can be spin coated with adjusting mixed liquid containing an additive for decreasing the surface energy in advance.

Figure 3A:
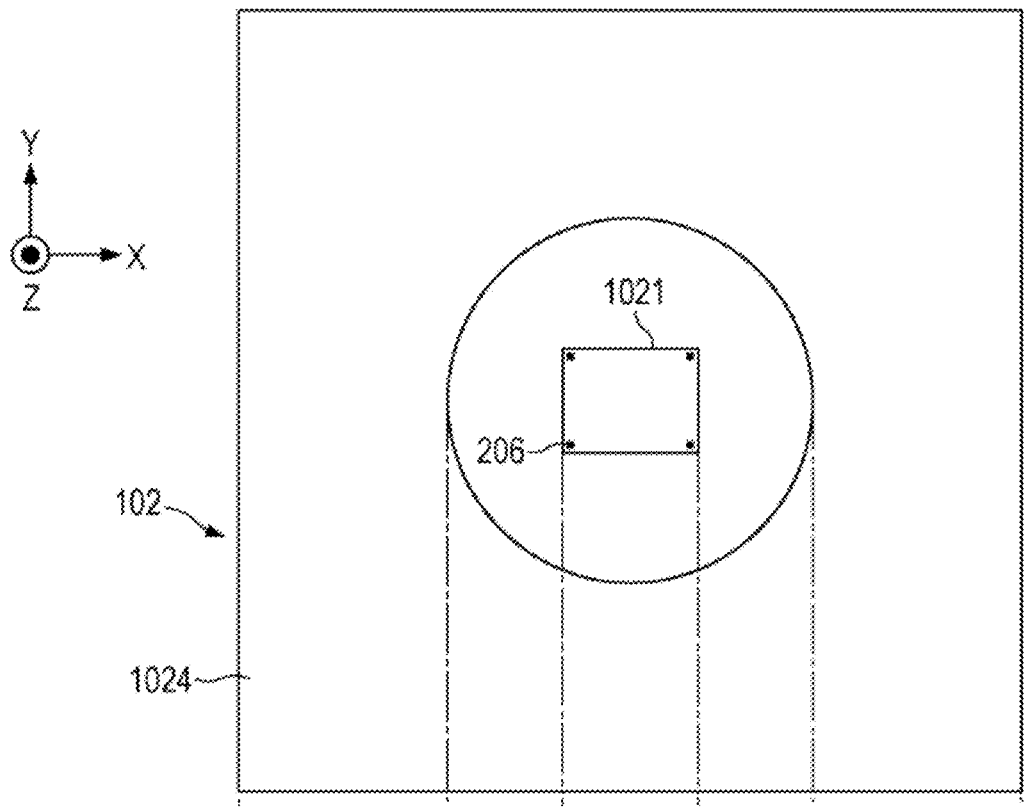
FIG. 3A and 3B are diagram illustrating the configuration of a mold.
Figure 3B:
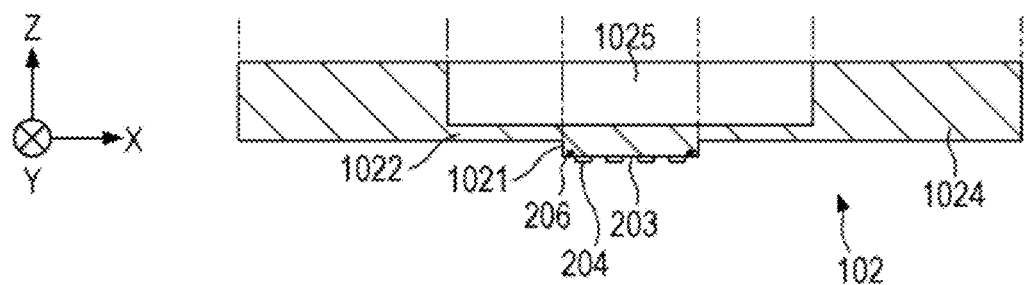

FIG. 3A and 3B schematically illustrates the configuration of the mold 102. Examples of the material of the mold 102 include fused silica, organic polymer, and metal; however, the mold 102 may be made of another material. The mold 102 includes a thin-plate-like movable portion (a diaphragm) 1022, a patterned portion (a mesa portion) 1021 protruding from the movable portion 1022, and a supporting unit 1024 that supports the movable portion 1022. The mold 102 has a cavity 1025 enclosed by the supporting unit 1024 at the back of the movable portion 1022 (on the opposite side from the patterned portion 1021). The cavity 1025 constitutes part of the above-described pressure chamber 133. The movable portion 1022 can be about 1 mm in thickness, for example. The patterned portion 1021 can be about 30 μm (micrometers) in thickness, for example. The surface of the patterned portion 1021 has a pattern including a protruding pattern 204 and a recessed pattern 203. The difference between the surface of the protruding pattern 204 and the surface of the recessed pattern 203, that is, the height of the protruding pattern 204, can be in the range from several tens of nanometers to several hundreds of nanometers, for example. The patterned portion 1021 includes one or a plurality of marks 206.

Figure 4A:
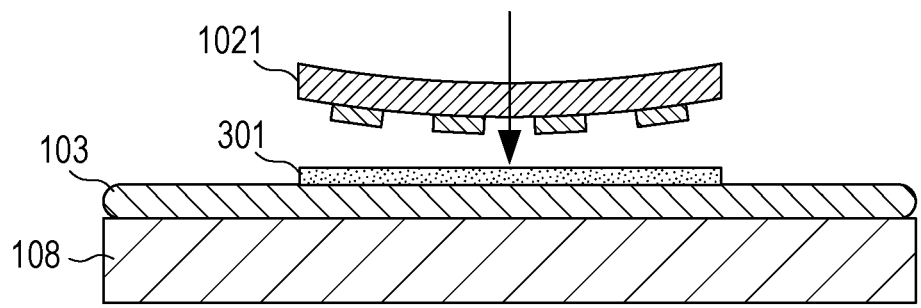
FIG. 4A is a diagram schematically illustrating a common imprinting process using an imprint apparatus.
Figure 4B:
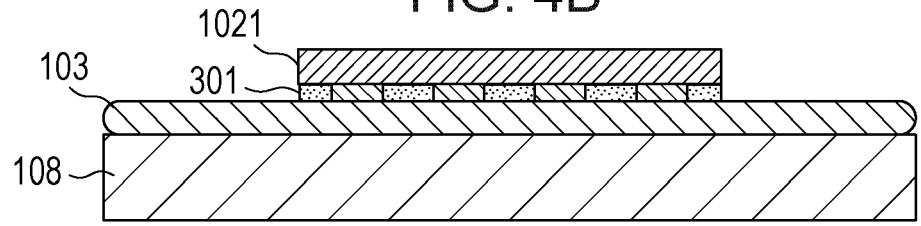
FIG. 4B is a diagram schematically illustrating the common imprinting process using the imprint apparatus.

A common imprinting process using the imprint apparatus NIL will be described with reference to FIGS. 4A to 4D. The following operation is controlled by the control unit 190. FIGS. 4A to 4D illustrate only the patterned portion 1021 of the mold 102 as a structure above the substrate 103 for the sake of simplicity. As schematically shown in FIG. 4A and 4B, the control unit 190 reduces the distance between the mold 102 (the patterned portion 1021) and the substrate 103 so that the pattern portion 1021 comes into contact with the imprint material 301 on the substrate. Specifically, as schematically shown in FIG. 4A, the control unit 190 first controls the mold driving unit 131 so that the mold 102 starts to lower, with purge gas supplied between the substrate 103 and the mold 102 by the gas supply unit 170. This causes the mold 102 to come close to the imprint material 301 supplied to the shot area of the substrate 103 by the dispenser 106. Before the start of the lowering of the mold 102 or in parallel with the lowering of the mold 102, the control unit 190 can control the pressure in the pressure chamber 133 with the pressure control unit 181 so that the mold 102 protrudes toward the substrate 103 (downward). In one example, it takes about several hundreds of milliseconds to deform the mold 102 into a target shape with the pressure control unit 181. For that reason, control of the pressure in the pressure chamber 133 with the pressure control unit 181 may be started in parallel with the operation of supplying the imprint material 301 to the substrate 103 with the dispenser 106. Next, as schematically shown in FIG. 4B, when part of the patterned portion 1021 of the mold 102 comes into contact with the imprint material 301, the control unit 190 controls the pressure control unit 181 so that the patterned portion 1021 becomes flat. The operation of bringing the mold 102 close to the substrate 103 can include a first operation and a second operation after the first operation. In the first operation, the mold 102 is brought close to the substrate 103 at a first speed. In the second operation, the mold 102 is brought close to the substrate 103 after the first operation at a second speed lower than the first speed, and the mold 102 comes into contact with the imprint material 301. This prevents a collision of the mold 102 (the patterned portion 1021) with the substrate 103. As schematically shown in FIG. 4B, the recessed pattern of the patterned portion 1021 is filled with the imprint material 301, with the patterned portion 1021 of the mold 102 in contact with the imprint material 301.

Figure 4C:
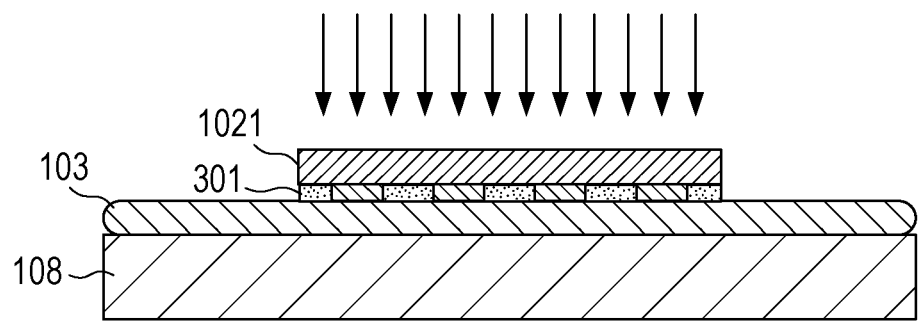
FIG. 4C is a diagram schematically illustrating a common imprinting process using an imprint apparatus.
Figure 4D:
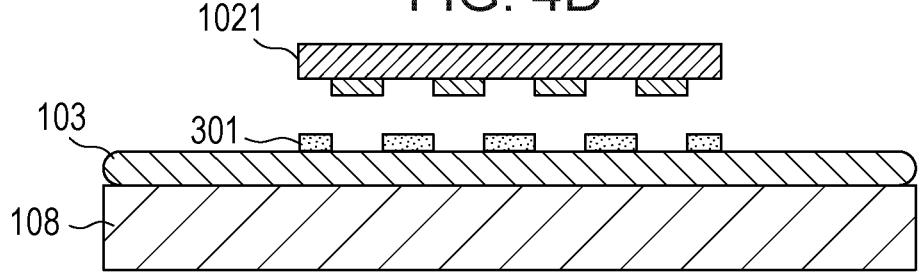
FIG. 4D is a diagram schematically illustrating the common imprinting process using the imprint apparatus.

Next, as schematically shown in FIG. 4C, the control unit 190 controls the curing unit 105 so that energy for curing the imprint material 301 (for example, light) is applied to the imprint material 301. This causes the imprint material 301 to be cured and the pattern of the patterned portion 1021 to be transferred to the imprint material 301. Next, as schematically shown in FIG. 4D, the control unit 190 controls the mold driving unit 131 so that the mold 102 (the patterned portion 1021) is separated from the cured imprint material 301.

Figure 5A:
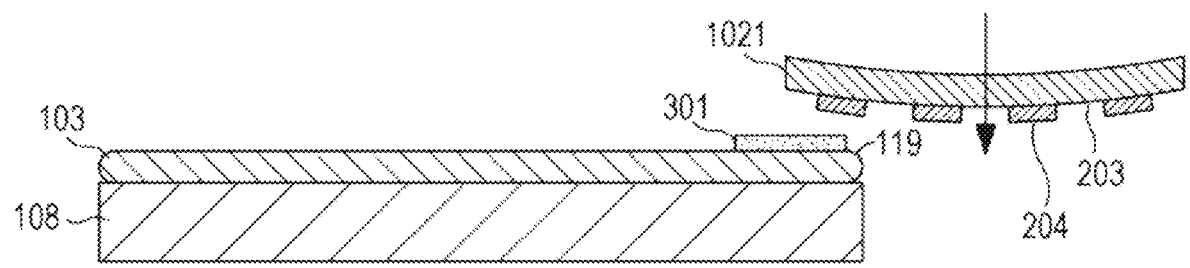
FIG. 5A is a diagram illustrating an issue that can occur in a common imprinting process on a chipped shot area.
Figure 5B:
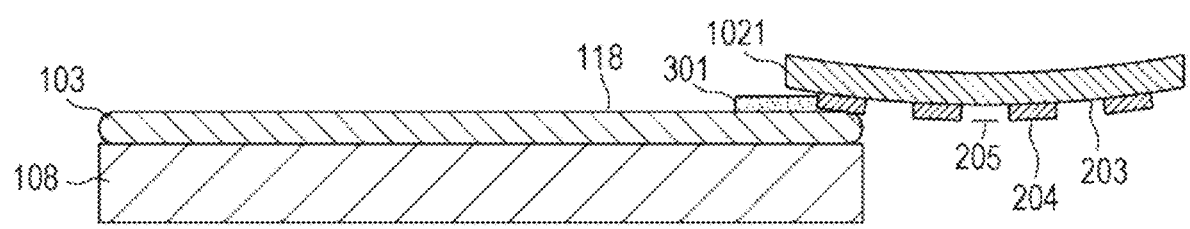
FIG. 5B is a diagram illustrating an issue that can occur in a common imprinting process on a chipped shot area.

An issue that can occur in a common imprinting process on a chipped shot area (a peripheral shot area) will be described with reference to FIGS. 5A and 5B. The chipped shot area is an area in which part of the pattern of the patterned portion 1021 is transferred to the imprint material 301 on the substrate 103. The chipped shot area includes the outer periphery (edge) 119 of the substrate 103. As schematically illustrated in FIG. 5A, the lowering of the mold 102 is started in a state in which the mold 102 is deformed to protrude downward. Thereafter, the periphery of the patterned portion 1021 of the mold 102 can collide with the edge 119 of the substrate 103 under circumstance where a center 205 (the lowest protruding portion of the protruding pattern 204) of the patterned portion 1021 of the mold 102 reaches a position lower than the surface 118 of the substrate 103. The protruding pattern 204 of the mold 102 colliding with the edge 119 of the substrate 103 can deteriorate or damage the mold 102 in some cases.

Figure 6A:
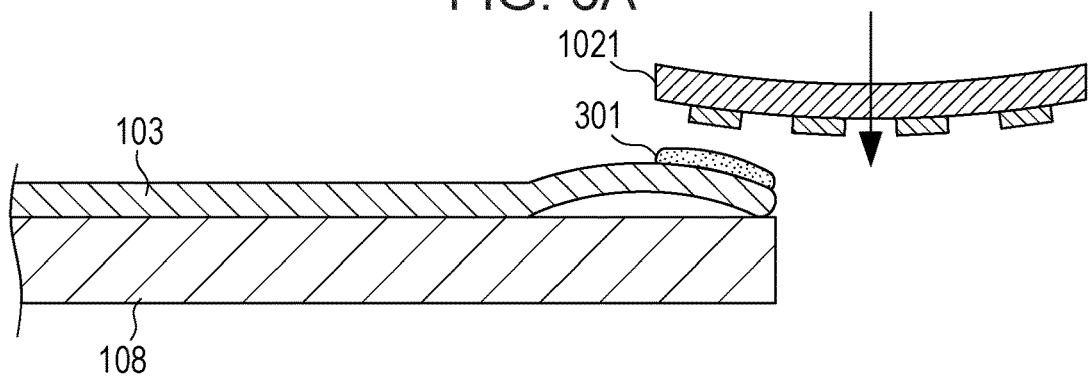
FIG. 6A is a diagram schematically illustrating an improved imprinting process.
Figure 6B:
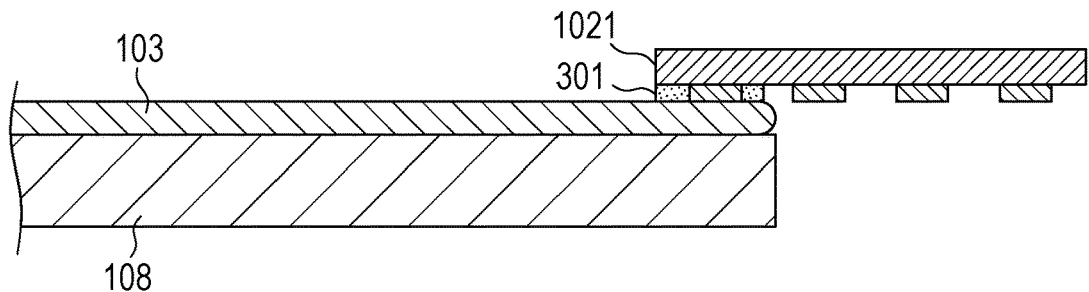
FIG. 6B is a diagram schematically illustrating the improved imprinting process.

FIGS. 6A to 6D schematically illustrate an imprinting process improved in the issue described with reference to FIGS. 5A and 5B. The improved imprinting process will be described with reference to FIGS. 6A to 6D. First, as schematically illustrated in FIGS. 6A and 6B, the control unit 190 reduces the distance between the mold 102 (the patterned portion 1021) and the substrate 103 so that the pattern portion 1021 comes into contact with the imprint material 301 on the substrate. Specifically, as schematically illustrated in FIG. 6A, the control unit 190 controls the shape of the mold 102 with the mold deforming mechanism 180 so that the mold 102 protrudes toward the substrate 103 (downward). In one example, it takes about several hundreds of milliseconds to deform the mold 102 into a target shape with the mold deforming mechanism 180. For that reason, control of the pressure in the pressure chamber 133 with the pressure control unit 181 may be started in parallel with the operation of supplying the imprint material 301 to the substrate 103 with the dispenser 106.

Furthermore, as schematically shown in FIG. 6A, the control unit 190 controls the shape of the substrate 103 with the sucking and deforming mechanism CDM in parallel with the deformation of the mold 102 so that the substrate 103 protrudes toward the mold 102 (upward). The control unit 190 controls the mold driving unit 131 so that the mold 102 starts to lower in a state in which purge gas is supplied to between the substrate 103 and the mold 102 by the gas supply unit 170. This lowering causes the mold 102 to come close to the imprint material 301 supplied to the shot area of the substrate 103 by the dispenser 106. Next, as schematically illustrated in FIG. 6B, the control unit 190 controls the sucking and deforming unit CDM so that, when part of the pattern of the patterned portion 1021 of the mold 102 comes into contact with the imprint material 301, the patterned portion 1021 becomes flat. Thus, controlling the surface shape of the substrate 103 so that the substrate 103 protrudes toward the mold 102 (upward) prevents a collision of the mold 102 with the edge 119 of the substrate 103 also in the case of imprinting on a chipped shot area, reducing deterioration of the mold 102.

The operation of bringing the mold 102 close to the substrate 103 can include a first operation and a second operation after the first operation. In the first operation, the mold 102 is brought close to the substrate 103 at a first speed. In the second operation, the mold 102 is brought close to the substrate 103 after the first operation at a second speed lower than the first speed, so that the mold 102 comes into contact with the imprint material 301. This prevents a collision of the mold 102 (the patterned portion 1021) with the substrate 103. As schematically shown in FIG. 6B, the recessed pattern of the patterned portion 1021 is filled with the imprint material 301, with the patterned portion 1021 of the mold 102 in contact with the imprint material 301.

Figure 6C:
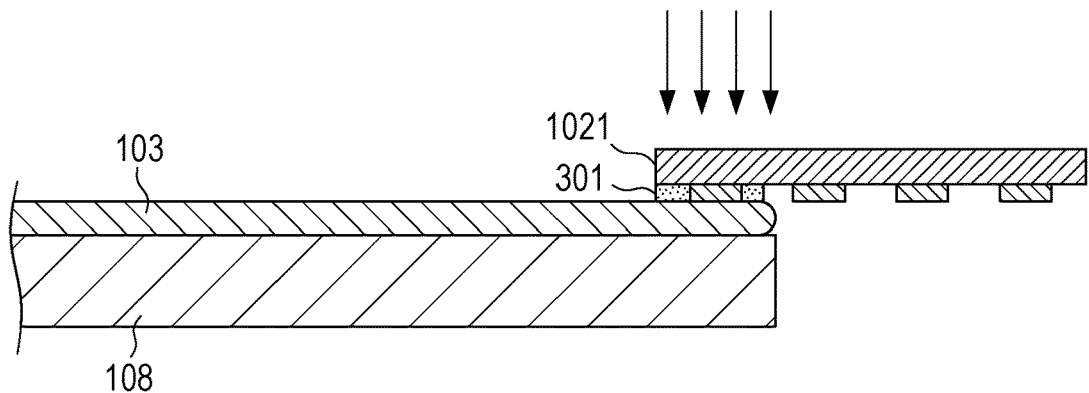
FIG. 6C is a diagram schematically illustrating the improved imprinting process.
Figure 6D:
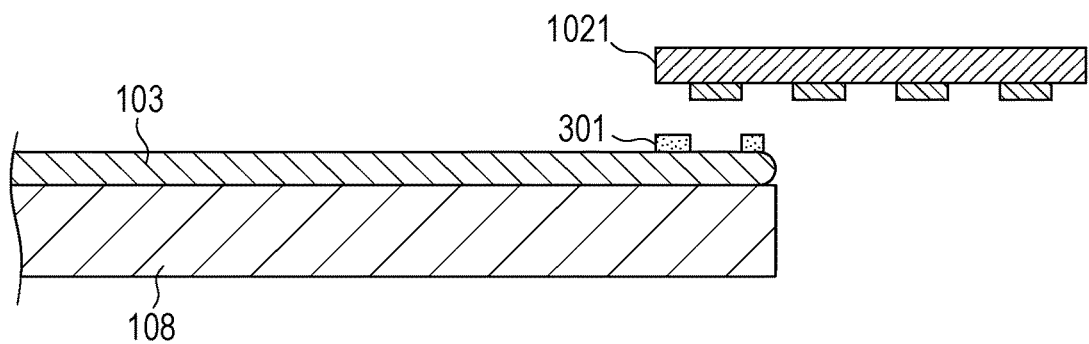
FIG. 6D is a diagram schematically illustrating the improved imprinting process.

Next, as schematically shown in FIG. 6C, the control unit 190 controls the curing unit 105 so that energy for curing the imprint material 301 (for example, light) is applied to the imprint material 301. This causes the imprint material 301 to be cured and the pattern of the patterned portion 1021 to be transferred to the imprint material 301. Next, as schematically shown in FIG. 6D, the control unit 190 controls the mold driving unit 131 so that the mold 102 (the patterned portion 1021) is separated from the cured imprint material 301.

The imprinting process illustrated in FIGS. 6A to 6D undergoes an improvement for reducing deterioration of the mold 102. However, the imprinting process illustrated in FIGS. 6A to 6D still has the possibility of deteriorating the mold 102 because the imprinting process does not take into consideration that the chipped shot area differs in surface geometry according to the position in the substrate 103 and that the amount of upward protrusion can differ according to the position in the substrate 103. This will be described with reference to FIGS. 7A and 7B.

Figure 7A:
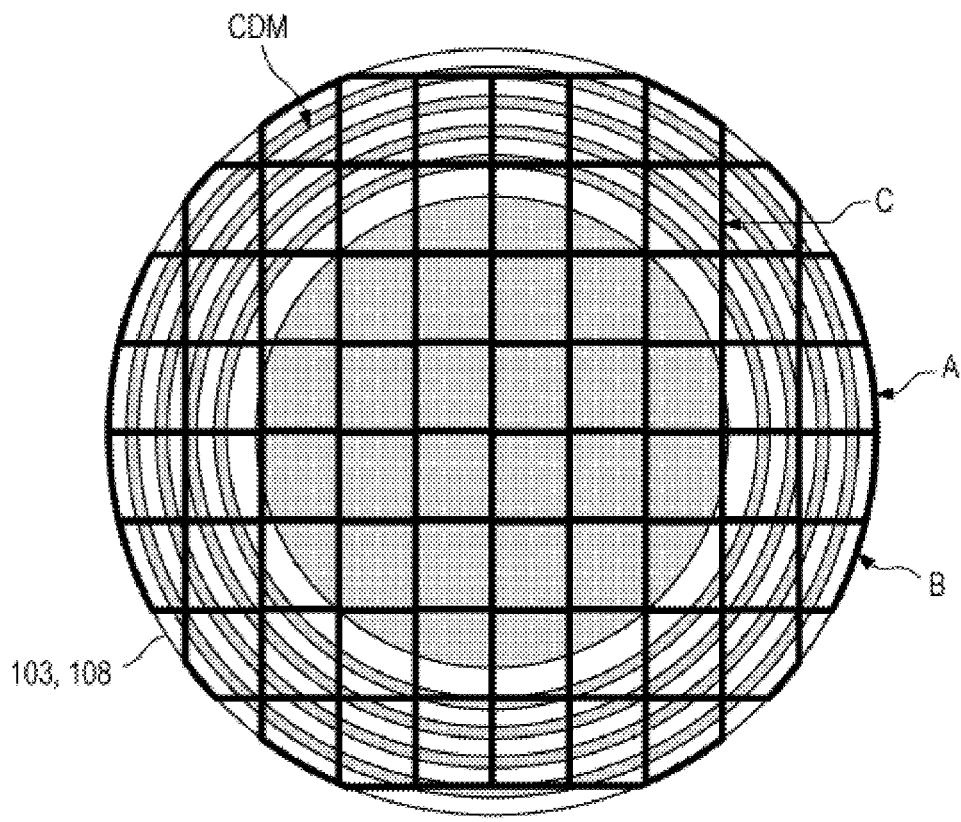
FIG. 7A is a diagram illustrating an issue that can occur in the improved imprinting process.

The possibility that the amount of protrusion differs according to the position in the substrate 103 will be described with reference to FIGS. 7A and 7B. FIG. 7A illustrates the substrate 103 and the substrate chuck 108 together with the sucking and deforming unit CDM. FIG. 7A also illustrates a shot layout (the layout of shot areas) with thick lines. In FIG. 7A, reference signs A and B denote chipped shot areas. The rectangular shot areas are complete shot areas C in which the entire pattern of the patterned portion 1021 of the mold 102 can be transferred. The shot areas in which part of their rectangles is cut out by the circle are chipped shot areas. The shot layout including chipped shot areas is typically defined as a layout in which the complete shot areas include a plurality of chip areas and the chipped shot areas include at least one chip area.

Figure 7B:
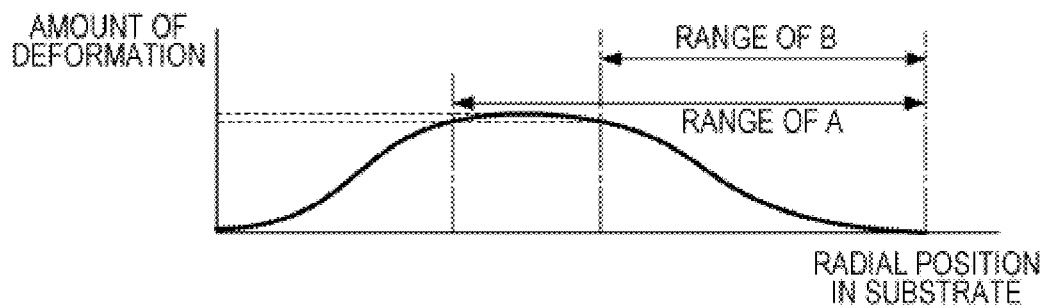
FIG. 7B is a diagram illustrating an issue that can occur in the improved imprinting process.

FIG. 7B illustrates the amount of deformation of the substrate 103 in the case where the same shape control is performed on the substrate 103 by the sucking and deforming unit CDM between an imprinting process on the chipped shot area A and an imprinting process on the chipped shot area B. The amount of deformation is the amount of deformation of the substrate 103 in the Z-axis direction with reference to a state in which the substrate 103 is not deformed. Between the chipped shot areas A and B, radial positions from the center of the substrate 103 differ. Accordingly, the amount of deformation at the uppermost position differs between the chipped shot areas A and B. This means that, when the mold 102 is brought close to the substrate 103, as schematically illustrated in FIG. 6A, the height of the mold 102 at the timing where the patterned portion 1021 of the mold 102 first comes into contact with the imprint material 301 differs between the chipped shot areas A and B.

In an embodiment described below, the control unit 190 determines conditions for an imprinting process on a shot area of the substrate 103 based on the surface shape of the shot area when the mold 102 is brought into contact with the imprint material 301 on the shot area. Such control can be applied not only to chipped shot areas A and B but also to complete shot areas C. Such control can be applied also to an imprinting process on a shot layout including only complete shot areas in which there is some difference according to the position of the complete shot area.

The surface geometry of a shot area of the substrate 103 when the mold 102 is brought into contact with the imprint material 301 on the shot area can be specified based on measurement executed prior to execution of an imprinting process on the shot area. Alternatively, the surface geometry of a shot area of the substrate 103 when the mold 102 is brought into contact with the imprint material 301 on the shot area may be specified based on measurement every time an imprinting process is executed. However, this method can decrease the throughput. The former method will be described hereinbelow by way of example.

Figure 8:
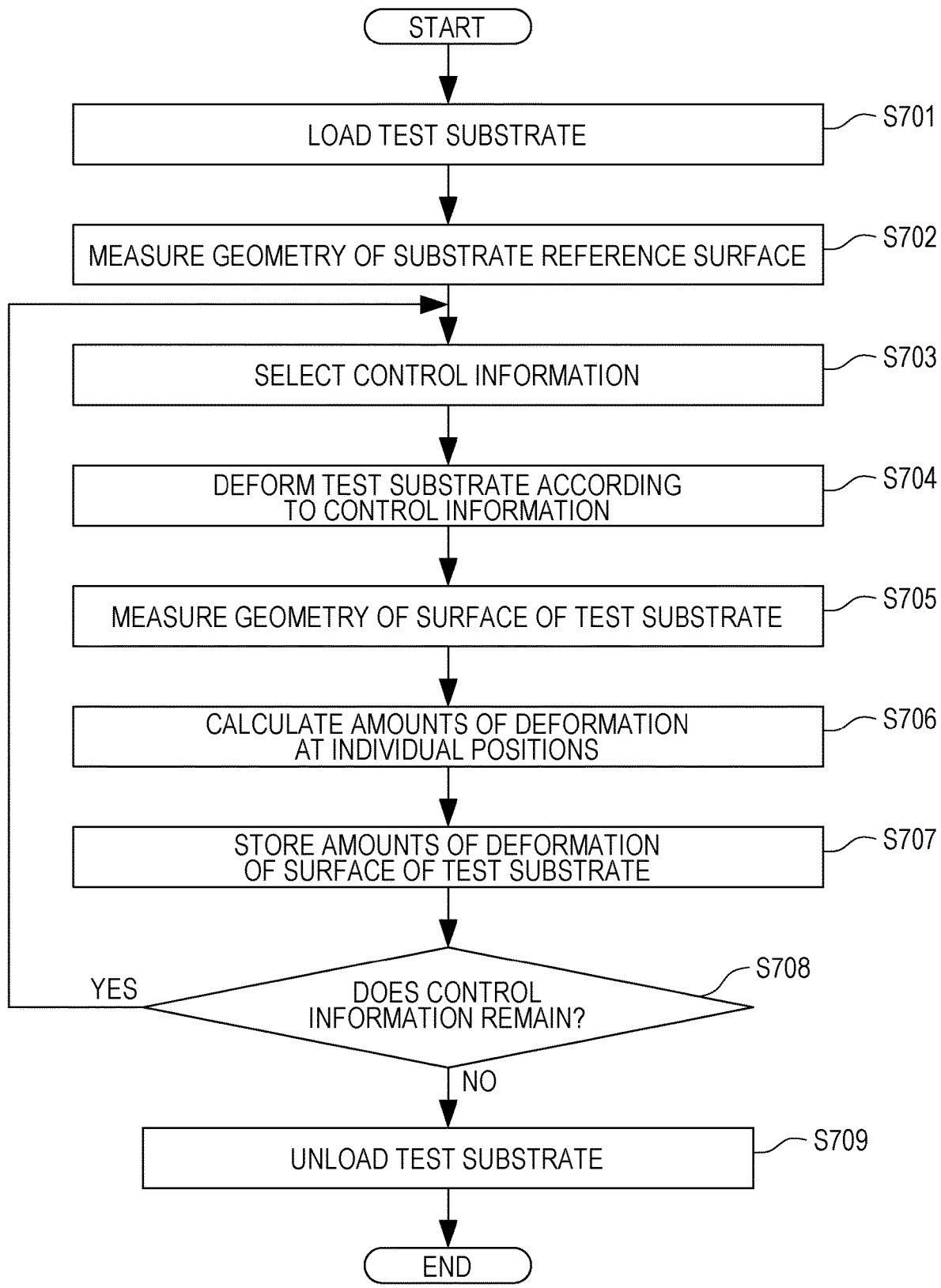
FIG. 8 is a flowchart of the operation of an imprint apparatus in a measuring mode according to an embodiment of the present disclosure.

FIG. 8 shows the operation of the imprint apparatus NIL in a measuring mode for measuring the surface geometry of a shot area of the substrate 103 when the mold 102 is brought into contact with the imprint material 301 on the shot area. This measuring mode is controlled by the control unit 190. At step S701, a test substrate is loaded on the substrate chuck 108. The test substrate may be either a substrate for producing an article, that is, a substrate to be processed in a producing mode, described later, or a test substrate.

At step S702, the control unit 190 makes the substrate measuring device 109 measure the heights of the surface of the test substrate at a plurality of positions of the test substrate while controlling the sucking and deforming unit CDM so that the test substrate is held flat. This allows the geometry of the surface of the test substrate (hereinafter, referred to as "substrate reference surface") in a state in which the test substrate is held flat. Normally, the test substrate is held flat by applying negative pressure sufficient to suck the substrate 103 to all of the plurality of recessed portions 121 to 125 of the sucking and deforming unit CDM.

At step S703, the control unit 190 selects one of a plurality of pieces of control information for controlling the sucking and deforming unit CDM. The one piece of control information is information for controlling the pressure control unit 150 to control the pressures of the plurality of recessed portions 121 to 125 of the sucking and deforming unit CDM. At step S704, the control unit 190 controls the pressure control unit 150 of the sucking and deforming unit CDM to deform the test substrate according to the control information selected at step S703. At that time, at least one of the plurality of recessed portions 121 to 125 is adjusted to positive pressure indicated by the control information. At step S705, the control unit 190 makes the substrate measuring device 109 measure the heights of the surface of the test substrate at a plurality of positions of the test substrate. Thus, the geometry of the surface of the test substrate deformed according to the control information is measured.

At step S706, the control unit 190 calculates the amounts of deformation of the surface of the test substrate at a plurality of positions based on the results of measurement at step S702 and the results of measurement at step S705. The amounts of deformation of the test substrate are obtained by subtracting the results of measurement at step S702 from the results of measurement at step S705 at the plurality of positions of the test substrate. At step S707, the control unit 190 stores the amounts of deformation of the test substrate at the individual positions calculated at step S706 as a deformation amount map. At step S708, the control unit 190 determines whether the process from step S704 to S707 has been executed on all of the plurality of pieces of control information. If control information remains, the process returns to step S703, and if no control information remains, the process goes to step S709. At step S709, the test substrate is unloaded from the substrate chuck 108. In this way, a plurality of deformation amount maps is stored in association with the plurality of pieces of control information.

FIG. 9 shows the operation of the imprint apparatus NIL in a producing mode for performing an imprinting process on the individual shot areas of the substrate 103 for producing articles. The producing mode is controlled by the control unit 190. At step S801, the substrate 103 is loaded on the substrate chuck 108. At step S802, the control unit 190 determines a shot area (hereinafter referred to as "target shot area") to be subjected to the imprinting process among the plurality of shot areas of the substrate 103. At step S803, the control unit 190 determines control information corresponding to the target shot area among a plurality of pieces of control information for controlling the sucking and deforming unit CDM. This means that the control unit 190 controls the sucking and deforming unit CDM to deform the substrate 103 according to the target shot area. At step S804, the control unit 190 specifies the surface geometry (for example, the maximum height) of the target shot area of the imprinting process based on the control information determined at step S803 and one of the deformation amount maps for the individual plurality of pieces of control information stored at step S707 in the measuring mode in FIG. 8. Specifically, the control unit 190 can specify, at step S804, the surface geometry (for example, the maximum height) of the target shot area based on a deformation amount map corresponding to the control information determined at step S803, where the corresponding deformation amount map is based on the calculation at step S703 in the measuring mode and selected at step S804 from among the deformation amount maps stored at the step S707 for the individual plurality of pieces of control information. If the substract reference surface can differ among the substrates 103, the substract reference surface of the substrate 103 can be measured using the substrate measuring device 109, and the surface geometry of the target shot area may be specified at step S804 based on the calculation result, the control information, and the deformation amount map. Also when the substract reference surface differs between the test substrate and the substrate 103, the substrate reference surface of the substrate 103 may be measured using the substrate measuring device 109, and the surface geometry of the target shot area may be specified at step S804 based on the measurement result, the control information, and the deformation amount map.

At step S805, the control unit 190 determines conditions for the imprinting process on the target shot area based on the surface geometry (for example, the maximum height) of the target shot area specified at step S805. At step S806, the imprinting process is controlled according to the conditions determined at step S805. The conditions for imprinting according to the shot area will be described later. At step S807, the control unit 190 determines whether an unprocessed shot area is present. If an unprocessed shot area is present, the process returns to step S802, and if no unprocessed shot area is present, the process goes to step S808. At step S808, the substrate 103 is unloaded from the substrate chuck 108.

The conditions for imprinting according to the shot area will be described hereinbelow. As described above, the operation of bringing the mold 102 close to the substrate 103 can include a first operation and a second operation after the first operation. In the first operation, the mold 102 is brought close to the substrate 103 at a first speed. In the second operation, the mold 102 is brought close to the substrate 103 after the first operation at a second speed lower than the first speed, and the mold 102 comes into contact with the imprint material 301. The conditions for the imprinting process according to the shot area can include the position or time at which the first speed is switched to the second speed. The position at which the first speed is switched to the second speed can be specified, for example, as the position of the mold 102 or the mold holding unit 101 in the Z-axis direction. The time the first speed is switched to the second speed can be specified using a time elapsed from the start time of the first operation.

The conditions for the imprinting process according to the target shot area may include the inclination of the mold 102 in the case where the mold driving unit 131 has the function of adjusting the inclination of the mold 102. In other words, the control unit 190 can make the mold driving unit 131 adjust the inclination of the mold 102 according to the target shot area to prevent the mold 102 from colliding with the edge 119 of the substrate 103. This reduces deterioration of the mold 102.

The conditions for imprinting process according to the target shot area can include the amount of deformation of the mold 102 with the mold deforming mechanism 180. In other words, the control unit 190 can make the mold deforming mechanism 180 adjust the amount of deformation of the mold 102 according to the target shot area to prevent the mold 102 from colliding with the edge 119 of the substrate 103. This reduces deterioration of the mold 102. Also, the control unit 190 may control the sucking and deforming unit CDM to deform the substrate 103 according to a shot area to be subjected to the imprinting process among a plurality of shot areas of the substrate 103.

The imprinting process illustrated in FIGS. 6A to 6D can pose issues other than deterioration of the mold 102, as described above. The imprinting process illustrated in FIGS. 6A to 6D does not take into consideration that the surface geometry of the target shot area differs among the shot areas, so that conditions for the imprinting process for the individual shot areas are not optimized, causing pattern forming defect. In the case where the surface geometry of the target shot area differs among shot areas, the flow rate of the purge gas to be supplied to the space between the shot area and the mold 102 from the gas supply unit 170 should be changed according to the target shot area. An inappropriate flow rate of the purge gas can cause issues in filling the recessed pattern of the patterned portion 1021 with the imprint material and curing the imprint material, resulting in a defective pattern. The conditions for the imprinting process according to the shot area can further include the flow rate of the purge gas supplied from the gas supply unit 170.

The control unit 190 can be a programmable logic device (PLD), such as a field programmable gate array (FPGA), an application specific integrated circuit (ASIC), a general-purpose programmable computer, or a combination of all or part of them.

A method for producing a device, or an article (for example, a semiconductor integrated circuit element and a liquid-crystal display element), includes a process for forming a pattern on a substrate (for example, a wafer, a glass plate, and a film substrate) using the above imprint apparatus. The production method can further include a process for processing (for example, etching) the substrate on which the pattern is formed. For other articles, such as patterned media (recording media) and optical devices, the production method can include, instead of etching, another process for processing the substrate on which the pattern is formed. The method for producing an article according to the embodiments has an advantage in at least one of the performance, quality, productivity, and production cost of the product over conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-236991 filed Dec. 3, 2015, which is hereby incorporated by reference herein in its entirety.

What is claimed is:

1. An imprint apparatus to perform an imprinting process for bringing a mold and an imprint material on a substrate into contact with each other and curing the imprint material, the imprint apparatus comprising:
a mold deforming mechanism configured to deform the mold to protrude toward the substrate;
a substrate deforming mechanism configured to deform the substrate in such a manner that a surface geometry of at least part of the substrate protrudes toward the mold; and
a controller configured to determine a condition for the imprinting process on a target shot area of the substrate,
wherein the controllers controls the substrate deforming mechanism to deform the substrate based on information as control information for controlling the target shot area to be performed, on the substrate, with an imprinting process among a plurality of shot areas such that a periphery of the mold deformed to protrude toward the substrate by the mold deforming mechanism does not collide with an edge of the substrate, and
wherein the controller determines the condition for the imprinting process to be performed onto the target shot area based on a shape of a surface of the target shot area of the substrate deformed based on the control information.

2. The imprint apparatus according to claim 1,
wherein the imprinting process includes a first operation for bringing the mold and the substrate close to each other at a first speed, a second operation for bringing the mold and the substrate from close to each other into contact with each other at a second speed lower than the first speed after the first operation, and an operation for curing the imprint material after the second operation, and
wherein the determined condition for the imprinting process includes selecting, based on a surface geometry of the target shot area surface, a position or time at which the first speed is switched to the second speed.

3. The imprint apparatus according to claim 1,
wherein the determined condition for the imprinting process includes deforming the substrate based on a surface geometry of the target shot area surface to be subjected to the imprinting process among a plurality of shot areas of the substrate, and
wherein, when the mold is to be brought into contact with the imprint material on the target shot area, the controller controls the substrate deforming mechanism to deform the substrate according to a determined condition of deforming the substrate.

4. The imprint apparatus according to claim 1, further comprising a measuring device configured to measure the surface geometry of the substrate,
wherein the imprint apparatus includes a measuring mode and a producing mode,
wherein, in the measuring mode, the controller executes an operation for (i) using the measuring device to measure an amount of deformation of a surface of a test substrate deformed by the substrate deforming mechanism according to each piece of control information, selected from a plurality of pieces of control information, to control the substrate deforming mechanism and (ii) storing results of measurement as a deformation amount map to thereby store a plurality of deformation amount maps in association with the plurality of pieces of control information,
wherein, in the producing mode, the controller (i) determines a condition for the imprinting process on the target shot area based on a deformation amount map that is selected from among the plurality of deformation amount maps and corresponds to mechanism control information, and (ii) controls the substrate deforming mechanism to deform the substrate based on the mechanism control information, and
wherein the mechanism control information is to control the substrate deforming mechanism, corresponds to a shot area to be subjected to the imprinting process, and is among the plurality of pieces of control information.

5. The imprint apparatus according to claim 1, further comprising a mold driving unit configured to drive the mold,
wherein the mold driving unit has a function for adjusting an inclination of the mold, and
wherein the determined condition for the imprinting process includes inclining the mold based on a surface geometry of the target shot area surface.

6. The imprint apparatus according to claim 1,
wherein the determined condition for the imprinting process includes deforming the mold based on a surface geometry of the target shot area surface to be subjected to the imprinting process among a plurality of shot areas of the substrate, and
wherein, when the mold is to be brought into contact with the imprint material on the target shot area, the controller controls the substrate deforming mechanism to deform the mold according to a determined condition of deforming the mold.

7. The imprint apparatus according to claim 1, further comprising a gas supply unit configured to supply purge gas into a space between the substrate and the mold,
wherein the determined condition for the imprinting process includes determining, based on a surface geometry of the target shot area surface, a flow rate of the purge gas supplied from the gas supply unit into the space between the substrate and the mold.

8. The imprint apparatus according to claim 1, wherein the substrate deforming mechanism controls the surface geometry of the substrate by controlling a distribution of pressure applied to a back surface of the substrate facing away from the mold.

9. The imprint apparatus according to claim 8, wherein the substrate deforming mechanism includes a substrate chuck, a plurality of grooves concentrically arranged on a surface of the substrate chuck, and a pressure controller that individually controls pressure in the plurality of grooves.

10. The imprint apparatus according to claim 1, wherein a determined condition based on a surface geometry of the target shot area surface is one in which the controller controls a shape of the substrate in parallel with deformation of the mold to reduce deterioration of the mold.

11. The imprint apparatus according to claim 10, wherein the controller controls so that, when part of a pattern of a patterned portion of the mold comes into contact with the imprint material, the patterned portion becomes flat in parallel with the shape of the substrate to prevent a collision of the mold with an edge of the substrate.

12. The imprint apparatus according to claim 1, wherein the controller specifies a surface geometry of a target shot area of the imprinting process based on (i) mechanism control information to control the substrate deforming mechanism and (ii) one deformation amount map associated with specified control information to control the substrate deforming mechanism, wherein the specified control information corresponds to the target shot area.

13. The imprint apparatus according to claim 12, wherein, in a case where a substrate reference surface can differ among multiple substrates to be used in the imprint apparatus, the controller specifies the surface geometry of the target shot area of the imprinting process further based on (iii) amounts of deformation of a surface of a test substrate calculated at a plurality of positions along the surface of the test subject.

14. The imprint apparatus according to claim 12, wherein, in a case where a substrate reference surface of a test substrate differs from a substrate reference surface of the substrate, the controller specifies the surface geometry of the target shot area of the imprinting process further based on (iii) results from measuring the substrate reference surface of the substrate using a substrate measuring device of the imprint apparatus.

15. The imprint apparatus according to claim 1,
wherein the substrate includes a first shot area and a second shot area, and
wherein, in a case where the second shot area is deformed by the substrate deforming mechanism using a first shape control, the second shot area includes a maximum amount of protrusion that is determined to be different from a maximum amount of protrusion of the first shot area when the first shot area is deformed by the substrate deforming mechanism using the first shape control.

16. The imprint apparatus according to claim 15, wherein the substrate deforming mechanism deforms the substrate based on a surface geometry of a shot area of the substrate being specified according to measurement executed before execution of the imprinting process on the substrate shot area.

17. The imprint apparatus according to claim 15, wherein the substrate deforming mechanism deforms the substrate based on the surface geometry of the shot area of the substrate being specified according to measurement executed at execution of the imprinting process on the substrate shot area.

18. The imprint apparatus according to claim 15,
wherein the first shot area and the second shot area each are a chipped shot area, and
wherein each chipped shot area is at least one of:
a shot area that is different in size from the complete shot area,
a shot area in which only a part of a pattern of the mold can be transferred to the imprint material as a result of a size of the chipped shot area,
a shot area that includes an outer peripheral edge of the substrate, and
a shot area that is not rectangular in shape.

19. The imprint apparatus according to claim 1,
wherein the surface geometry of at least part of the substrate is characterized by a height of the target shot area surface at a plurality of positions along the target shot area surface, and
wherein the mold and the substrate are deformed to protrude towards each other.

20. A method for an imprint apparatus to perform an imprinting process for bringing a mold and an imprint material on a substrate into contact with each other and curing the imprint material, wherein the imprint apparatus includes a mold deforming mechanism configured to deform the mold to protrude toward the substrate, and a substrate deforming mechanism configured to deform the substrate in such a manner that a surface geometry of at least part of the substrate protrudes toward the mold, the method comprising:
determining a condition for the imprinting process on a target shot area of the substrate;
controlling the substrate deforming mechanism to deform the substrate based on information as control information for controlling the target shot area to be performed, on the substrate, with an imprinting process among a plurality of shot areas such that a periphery of the mold deformed to protrude toward the substrate by the mold deforming mechanism does not collide with an edge of the substrate; and
determining the condition for the imprinting process to be performed onto the target shot area based on a shape of a surface of the target shot area of the substrate deformed based on the control information.

* * * * *